(12) United States Patent
Lee

(10) Patent No.: US 7,755,158 B2
(45) Date of Patent: Jul. 13, 2010

(54) IMAGE SENSOR AND METHOD FOR MANUFACTURING THEREOF

(75) Inventor: Min Hyung Lee, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 52 days.

(21) Appl. No.: 11/967,407

(22) Filed: Dec. 31, 2007

(65) Prior Publication Data

US 2008/0308888 A1 Dec. 18, 2008

(30) Foreign Application Priority Data

Jun. 12, 2007 (KR) .................. 10-2007-0057065

(51) Int. Cl.
*H01L 31/05* (2006.01)
(52) U.S. Cl. .............. 257/459; 257/290; 257/448; 257/E31.061
(58) Field of Classification Search .......... 257/458, 257/461, E31.061, 233, 290, 291, 292, 444, 257/448, 459, 656, 657; 250/208.1, 214.1, 250/226, 239, 370.14; 348/294, 274, 315
See application file for complete search history.

(56) References Cited

U.S. PATENT DOCUMENTS

| 6,018,187 | A  | * | 1/2000  | Theil et al. ............. 257/458 |
| 6,252,218 | B1 | * | 6/2001  | Chou ................... 250/208.1 |
| 6,759,262 | B2 | * | 7/2004  | Theil et al. ............. 438/48  |
| 6,841,411 | B1 | * | 1/2005  | Varghese ............... 438/94   |
| 6,995,411 | B2 |   | 2/2006  | Yaung et al.                     |
| 7,067,891 | B2 | * | 6/2006  | Yaung et al. ........... 257/414  |
| 7,101,726 | B2 | * | 9/2006  | Yamamoto et al. ....... 438/69   |
| 7,288,429 | B2 | * | 10/2007 | Yaung et al. ........... 438/74   |
| 7,411,233 | B2 | * | 8/2008  | Chao et al. ............ 257/292  |
| 7,482,646 | B2 | * | 1/2009  | Gao et al. ............. 257/292  |

FOREIGN PATENT DOCUMENTS

| CN | 1679164      | 10/2005 |
| JP | 2006-253422  | 9/2006  |
| KR | 2003-0040865 | 5/2003  |
| KR | 2007-0026975 | 3/2007  |

\* cited by examiner

*Primary Examiner*—Davienne Monbleau
*Assistant Examiner*—Eduardo A Rodela
(74) *Attorney, Agent, or Firm*—Sherr & Vaughn, PLLC

(57) ABSTRACT

An image sensor includes a semiconductor substrate having a pixel region and a peripheral circuit region. An interlayer dielectric layer has metal wirings and a pad formed over the semiconductor substrate. A lower electrode is selectively formed over the metal wirings. A photo diode is formed over the interlayer dielectric layer of the pixel region. An upper electrode formed over the photo diode. Therefore, a vertical integration of the transistor and the photodiode may approach a fill factor to 100%, and provide higher sensitivity, implement more complicated circuitry without reducing sensitivity in each unit pixel, improve the reliability of the image sensor by preventing crosstalk, etc., between the pixels, and improve light sensitivity by increasing the surface area of the photo diode in the unit pixel.

11 Claims, 9 Drawing Sheets

IMAGE SENSOR AND METHOD FOR MANUFACTURING THEREOF

Figure 1:
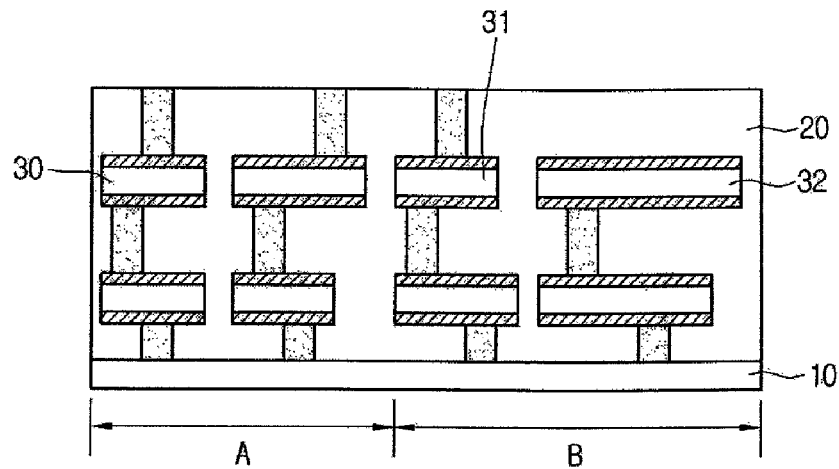

The present application claims priority under 35 U.S.C. 119 to Korean Patent Application No. 10-2007-0057065, filed on Jun. 12, 2007, which is hereby incorporated by reference in its entirety.

BACKGROUND

Image sensors, which are semiconductor devices for converting an optical image into an electrical signal, may be categorized as charge coupled device (CCD) image sensors and complementary metal oxide silicon (CMOS) image sensors.

CCDs have disadvantages. These include complicated driving requirements, relatively high power consumption, and a complicated manufacturing process which requires a multi-stage photolithography process. As a next generation image sensor for overcoming the disadvantages of CCDs, CMOS image sensors have attracted interest.

CMOS image sensors use a photo diode and a MOS transistor in each unit pixel. Images are detected by sequentially detecting the electrical signals from each unit pixel. CMOS image sensors according to the related art can be divided into a photo diode region for receiving light signals and changing them into electrical signals, and a transistor region for processing the electrical signals. However, the CMOS image sensor according to the related art uses a structure having the photo diode horizontally arranged with the transistor.

So while the disadvantages of the CCD image sensor have been reduced by the horizontal type CMOS image sensor, the horizontal type CMOS image sensor according to the related art still has problems. In other words, in the planar CMOS image sensor according to the related art, the photo diode and the transistor are manufactured to be horizontally adjacent to each other on the substrate. Accordingly, additional area is required to accommodate both the photo diode and the transistor. As a result, fill factor (the percentage of the area filled by photosensitive regions) may be reduced, and higher resolutions may be limited.

In the planar CMOS image sensor according to the related art, it is very difficult to simultaneously optimize the manufacturing processes of the photo diode and the transistor. For example, in the transistor process, a shallow junction for low sheet resistance is required; however, in the photo diode process, such a shallow junction may not be proper.

In a planar CMOS image sensor according to the related art, as additional on-chip functions are integrated onto the image sensor, the size of the unit pixel may be increased for maintaining the photosensitivity of the image sensor, or the area for the photo diode may be reduced for maintaining a pixel size. If the unit pixel size is increased the resolution of the image sensor is reduced. If the area of the photo diode is reduced to maintain unit pixel size, the photosensitivity of the image sensor is reduced.

SUMMARY

Embodiments relate to an image sensor capable of providing enhanced integration of transistor circuitry and photodiodes, including a method for manufacturing the image sensor. Embodiments relate to an image sensor which maximizes resolution and sensitivity at the same time, including a method for manufacturing the image sensor.

Embodiments relate to an image sensor and a method for manufacturing thereof capable of improving a process step while adopting a vertical photo diode. Embodiments relate to an image sensor including a semiconductor substrate having a pixel region and a peripheral circuit region. An interlayer dielectric layer having metal wirings and a pad may be formed over the semiconductor substrate. A lower electrode may be selectively formed over the metal wirings. A photo diode may be formed over the interlayer dielectric layer of the pixel region. An upper electrode may be formed over the photo diode.

Embodiments relate to a method for manufacturing an image sensor including forming a pixel region and a peripheral circuit region over a semiconductor substrate. The method includes forming an interlayer dielectric layer having metal wirings and a pad over the semiconductor substrate. The method includes selectively forming a lower electrode over the metal wirings. The method includes forming a photo diode over the interlayer dielectric layer of the pixel region, and forming an upper electrode over the photo diode.

DRAWINGS

Example FIGS. 1 to 12 are process cross-sectional views of an image sensor according to embodiments.

Example FIGS. 13 to 21 are process cross-sectional views of an image sensor according to embodiments.

DESCRIPTION

Figure 12:
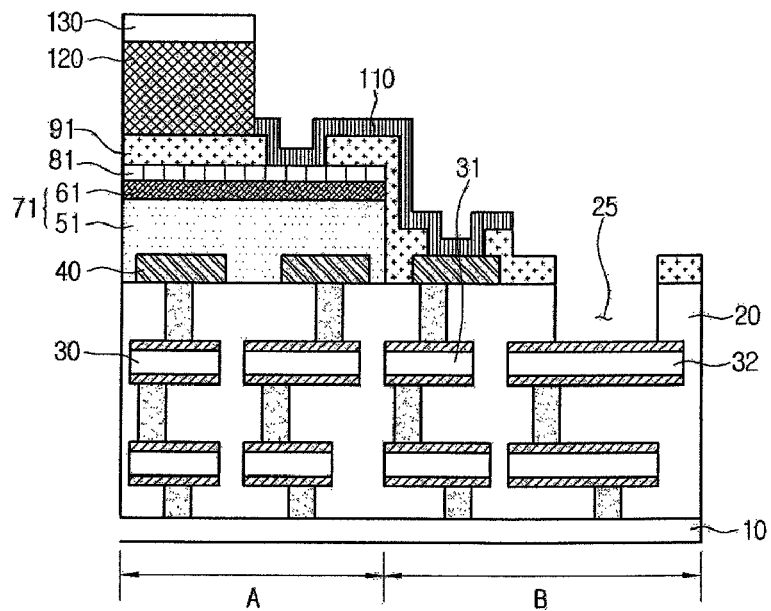
Figure 13:
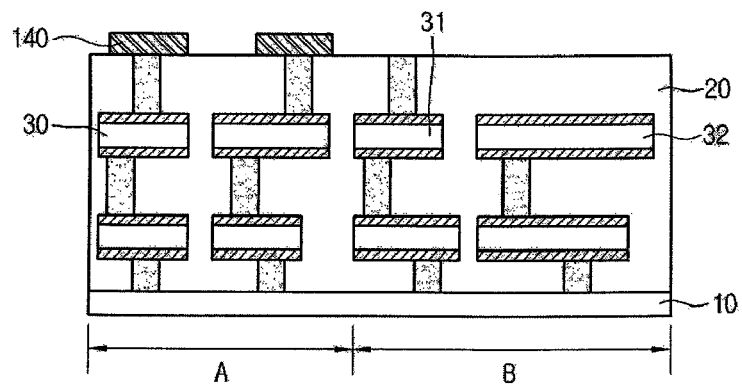

Example FIG. 12 is a cross-sectional view showing an image sensor according to embodiments. The image sensor according to embodiments includes a semiconductor substrate 10 having a pixel region A and a peripheral circuit region B. An interlayer dielectric layer 20 having metal wirings 30 and 31 and a pad 32 may be formed over the semiconductor substrate 10. A lower electrode 40 may be selectively formed over the metal wirings 30 and 31. A photo diode 71 may be formed over the interlayer dielectric layer 20 of the pixel region A. An upper electrode 81 may be formed over the photo diode 71, and a passivation layer 91 formed over the upper electrode 81.

The photo diode 71 may be formed of an intrinsic layer 51 and a conductive layer 61. The upper electrode 81 can be formed over only the upper surface of the photo diode 71. The passivation layer 91 can be provided with a first open hole 92 and a second open hole 93 (see example FIG. 7) that exposes the upper electrode 81 and the lower electrode 40 over the peripheral region B, respectively.

An upper wiring 110 connected to the upper electrode 81 may be formed over the passivation layer 91 having the first open hole 92 and the second open hole 93. A color filter 120 and a protective layer 130 can be formed over the upper electrode 81. For example, the passivation layer 91 can be formed of any one of an oxide film and a nitride film. For example, an upper wiring 110 connected to the upper electrode 81 can be formed of metal materials such as aluminum.

Hereinafter, a method for manufacturing an image sensor according to embodiments will be described with reference to example FIGS. 1 to 12. Referring to example FIG. 1, the interlayer dielectric layer 20 having metal wirings 30 and 31 is formed over the semiconductor substrate 10 on which the CMOS circuit is formed.

The semiconductor substrate 10 can be formed with a device isolating layer defining an active region and a field region and the pixel region A and the peripheral circuit region B can be formed over the active region. A unit pixel is formed over the pixel region A and a peripheral circuit unit is formed over the peripheral circuit region B to implement images by sequentially detecting electrical signals of each unit pixel.

The CMOS circuit, which is configured of a transfer transistor connected a photo diode, as described later, to convert light generated charges into electrical signals, a reset transistor, a drive transistor, a select transistor, etc., can be formed in the unit pixel formed over the pixel region A.

The interlayer dielectric layer 20 and the metal wirings 30 and 31 for connection with power supply lines or signal lines are formed over the upper portion of the semiconductor substrate 10 on which the CMOS circuit is formed. The interlayer dielectric layer 20 can be formed of a plurality of layers. The metal wirings 30 and 31 penetrating through the interlayer dielectric layer 20 can be formed in plural. For example, the interlayer dielectric layer 20 can be formed of an oxide film. Also, the metal wirings 30 and 31 can be formed of a variety of conductive materials, including metal, alloy, or silicide, that is, aluminum, copper, cobalt, or tungsten, etc. The metal wirings 30 and 31 are arranged for each unit cell to connect the CMOS circuit to the photo diode 70. Furthermore, when forming the metal wirings 30 and 31, a pad 32 connected to the peripheral circuit region B may be formed. After forming the metal wirings 30 and 31 and the pad 32 connected to the CMOS circuit of the semiconductor substrate 10 over the interlayer dielectric layer 20, the metal wiring 30 can be patterned for the unit pixel of the photo diode 70. Therefore, the photo diode 70 is formed over the interlayer dielectric layer 20 and electrically connected to the metal wirings 30 and 31.

Figure 2:
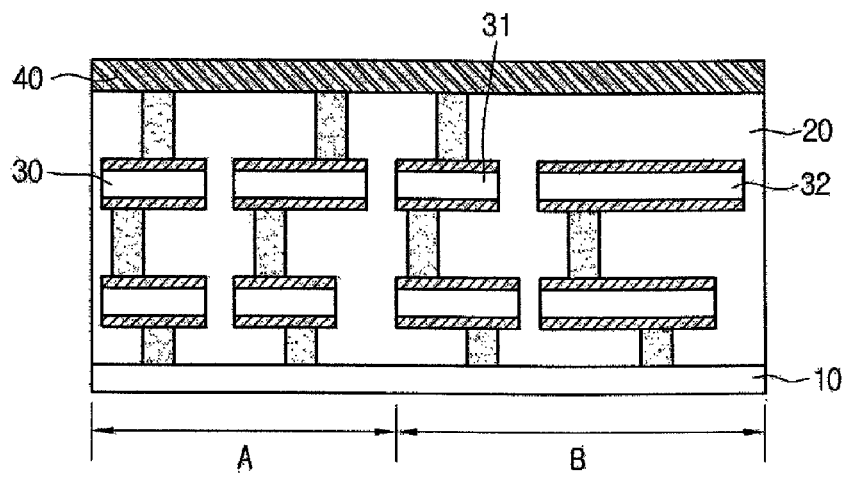
Figure 3:
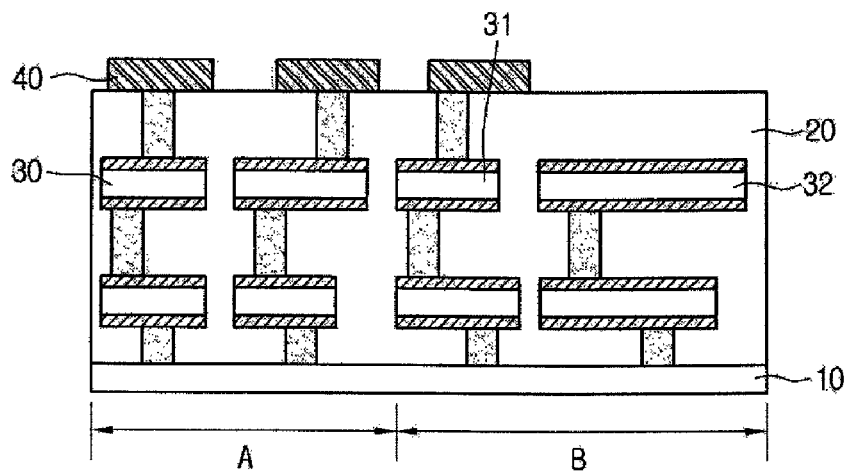

Referring to example FIGS. 2 and 3, before forming the photo diode 70, the lower electrode 40 can be formed over the metal wirings 30 and 31. For example, the lower electrode 40 can be formed of metals, such as Cr, Ti, TiW and Ta. The lower electrode 40 can be formed only over the upper portions of the metal wirings 30 and 31 with a lithography process after forming a chromium (Cr) layer over the interlayer dielectric layer 20. The photo diode 70 is formed over the interlayer dielectric layer 20 having the metal wirings 30 and 31 and the pad 32. The photo diode 70 is formed over the upper portion of the interlayer dielectric layer 20 to receive external incident light and convert and store it into an electrical form. In embodiments, an IP diode is used as the photo diode. Metal, intrinsic amorphous silicon, and p-type amorphous silicon form a junction to make the diode. The performance of the photo diode is determined by the efficiency converting external light into an electrical form and total charge capacitance. The related art photo diode generates charges and stores electric charges in a depletion region generated in a heterojunction of P-N, N-P, N-P-N, P-N-P, etc. However, the IP diode uses intrinsic amorphous silicon, which is a pure semiconductor, in a junction between the p-type silicon and the metal. The IP diode has an advantage in generating and storing charges since all of the intrinsic amorphous silicon formed between the p-type amorphous silicon and the metal is the depletion region. In the embodiment, the IP diode is used as the photo diode and the structure of the diode can be formed in a structure of P-I-N, N-I-P, I-P, etc. In embodiments, for example, a pin diode with an I-P structure is used and the intrinsic amorphous silicon is referred to as an intrinsic layer and the p-type amorphous silicon is referred to as a conductive layer.

Figure 4:
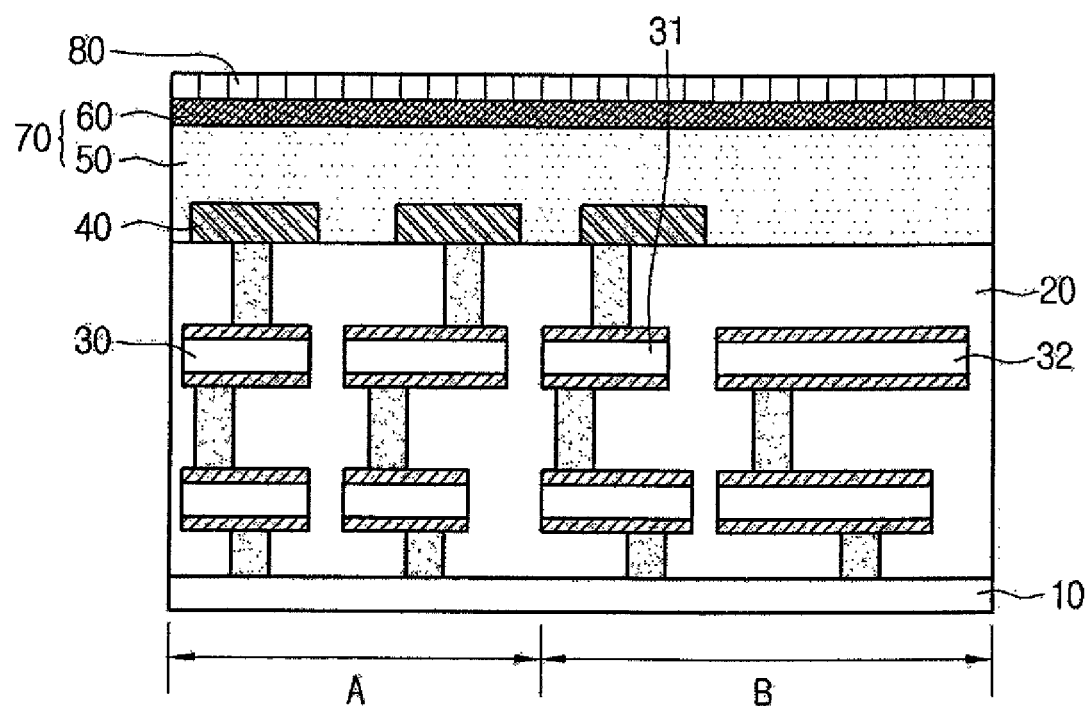

A method for forming the photo diode 70 using the IP diode will be described with reference to example FIG. 4. An intrinsic layer 50 is formed over the interlayer dielectric layer 20. The intrinsic layer 50 may be an I layer of an I-P diode adopted in embodiments. The intrinsic layer 50 may be formed using intrinsic amorphous silicon. The intrinsic layer 50 can be formed by, for example, a chemical vapor deposition CVD, in particular, a plasma enhanced CVD (PECVD), etc. For example, the intrinsic layer 50 may be formed of amorphous silicon by the PECVD using silane gas (SiH$_4$), etc. The intrinsic layer 50 may be thicker by a factor of about 10 to 1,000 than that of the conductive layer 60. As the thickness of the intrinsic layer 50 increases, the depletion region of the pin diode is increased, making it possible to store and generate a larger amount of photo-generated charges. Before forming the intrinsic layer 50, an n-type conductive layer may be formed; however, the description thereof is omitted in embodiments. The conductive layer 60 may be formed over the semiconductor substrate 10 over which the intrinsic layer 50 is formed. The conductive layer 60 may be a P-layer of an I-P diode in embodiments. In other words, the conductive layer 60 may be a P-type conductive layer, but it is not limited thereto. For example, the conductive layer 60 may be formed using a P-doped amorphous silicon, but it is not limited thereto. The conductive layer 60 can be formed of the P-doped amorphous silicon by means of CVD, in particular, PECVD, for example, by mixing the silane gas (SiH$_4$) with gas such as BH$_3$ or B$_2$H$_6$, etc. The photo diode 70 formed of the intrinsic layer 50 and the conductive layer 60 is vertically integrated with the CMOS circuit in the pixel region A so that the fill factor of the photo diode 70 may approach 100%.

An upper electrode 80 is formed over the upper portion of the semiconductor substrate 10 over which the photo diode 70 is formed. The upper electrode 80 may be substantially transparent and highly conductive. For example, the upper electrode 80 can be formed of any one of indium tin oxide (ITO), cadmium tin oxide (CTO), and ZnO$_2$.

Figure 5:
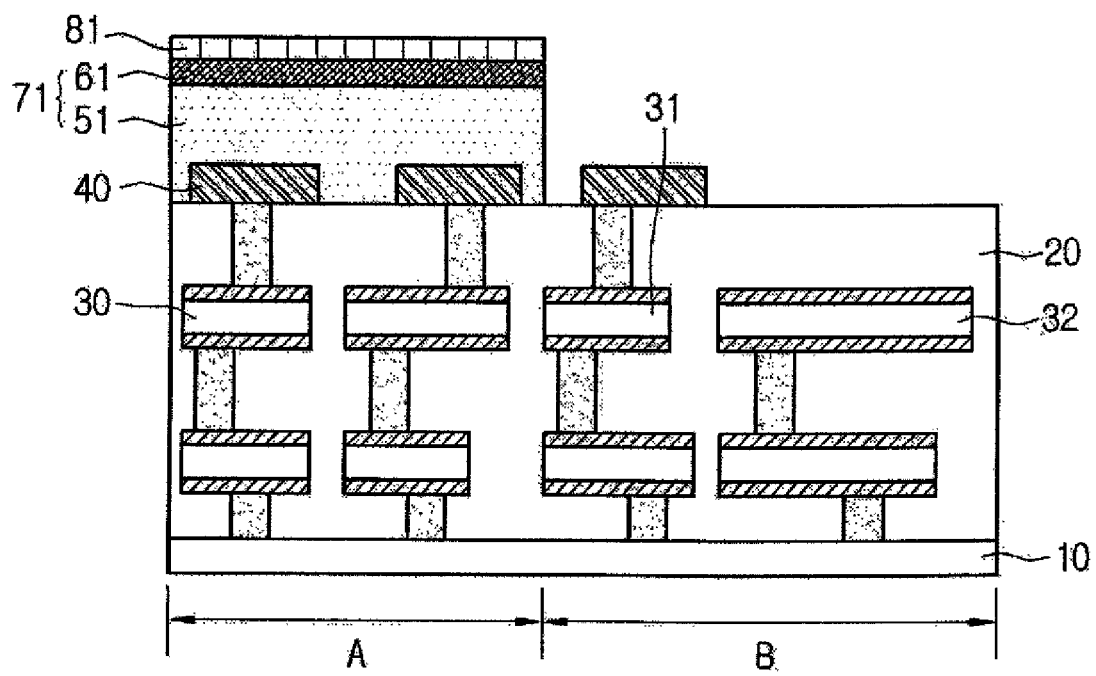

Referring to example FIG. 5, the photo diode 70 and the upper electrode 80 formed over the interlayer dielectric layer 20 may be patterned so that the photo diode 71 and the upper electrode 81 formed of the intrinsic layer 51 and the conductive layer 61 are formed only over the pixel region A. The photo diode 71 and the upper electrode 81 are formed only over the pixel region A by a photolithography process. The portions of the intrinsic layer 50, the conductive layer 60, and the upper electrode 80 over the peripheral circuit region B are removed so that the interlayer dielectric layer 20 and the metal wirings 30, 31 or the lower electrode 40 are exposed.

Figure 6:
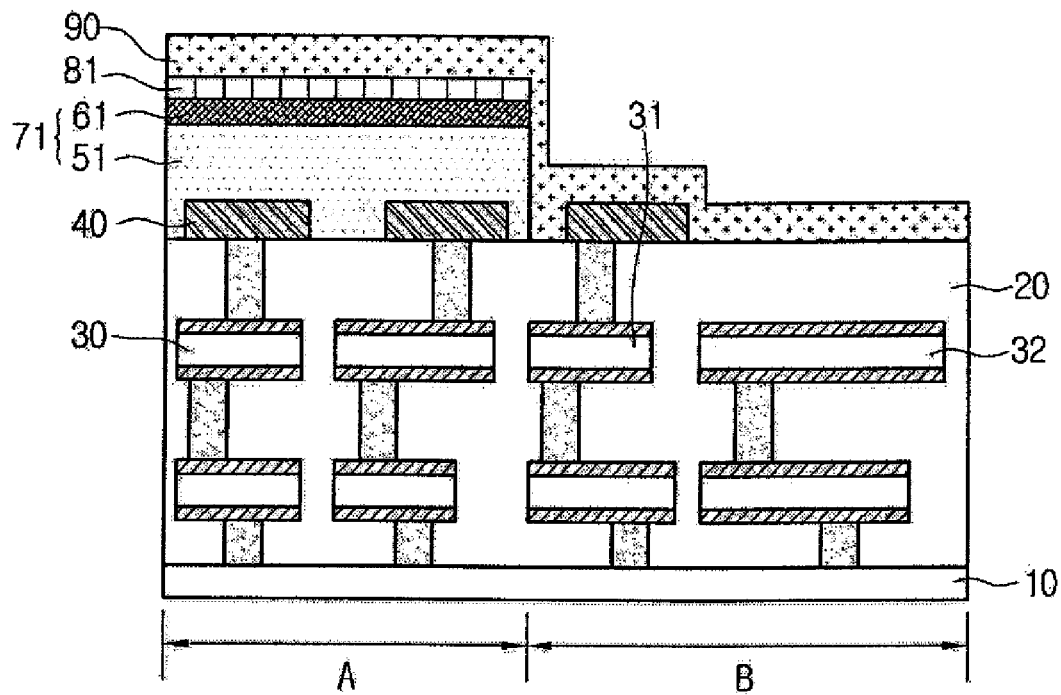

Referring to example FIG. 6, a passivation layer 90 is formed over the interlayer dielectric layer 20 including upper electrode 81. For example, the passivation layer 90 may be formed of an oxide film (SiO$_2$) or a nitride film (SiN). Specifically, the oxide film and the nitride film may be stacked by the PECVD process in the formation of the passivation 90. After the formation of the passivation layer 90, a heat treatment may be performed at a temperature of 200° C. to 400° C. under an H$_2$ atmosphere. The reason for performing heat treatment under H$_2$ atmosphere is that H$_2$ ions are diffused into the CMOS circuit region of the semiconductor substrate 10 to improve the characteristics of the image sensor. Also, since the passivation layer 90 surrounds the side region of the photodiode 71, it blocks the light incident to the side portion of the photo diode 71 so that cross talk and noise can be blocked.

Figure 7:
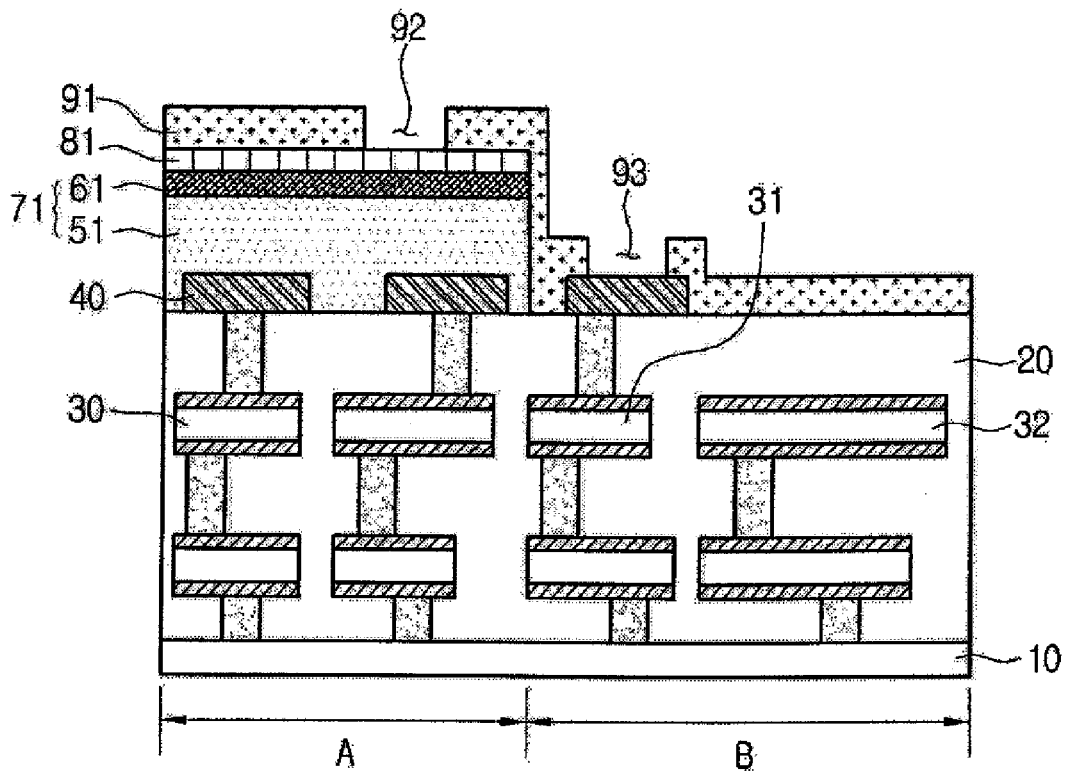

Referring to example FIG. 7, the passivation layer 90 is selectively etched so that the upper electrode 81 of the pixel region A and the lower electrode 40 of the peripheral circuit region B are exposed. Upper electrode 81 and lower electrode 40 are exposed simultaneously by photolithographically etching the passivation layer 90 to form a first open hole 92 exposing the surface of the upper electrode 81 and a second open hole 93 exposing the surface of the lower electrode 40.

In particular, the first open hole 92 can be formed at an edge region of the upper surface of the upper electrode 81 formed over the pixel region A.

Figure 8:
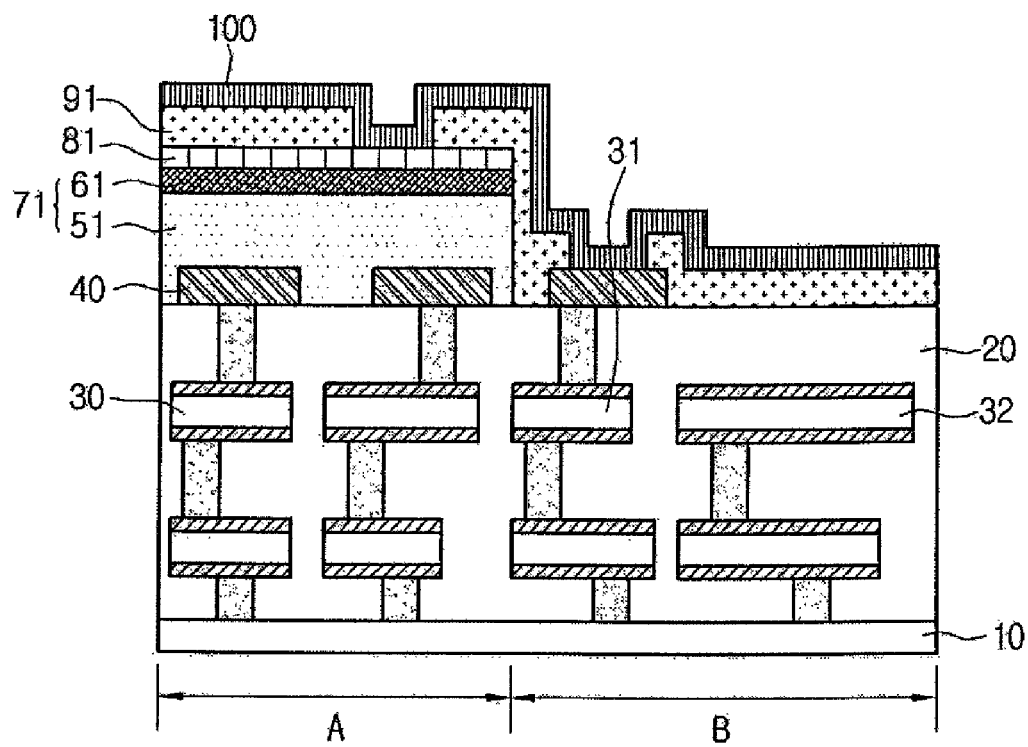

Referring to example FIG. 8, the upper wiring layer 100 is formed over the passivation layer 91 over which the first and second open holes 92 and 93 are formed. The upper wiring layer 100 is electrically connected to the upper electrode 81 of the pixel region A and the lower electrode 40 of the peripheral circuit region B through the first and second open holes 92 and 93. For example, the upper wiring layer 100 can be formed of aluminum.

Figure 9:
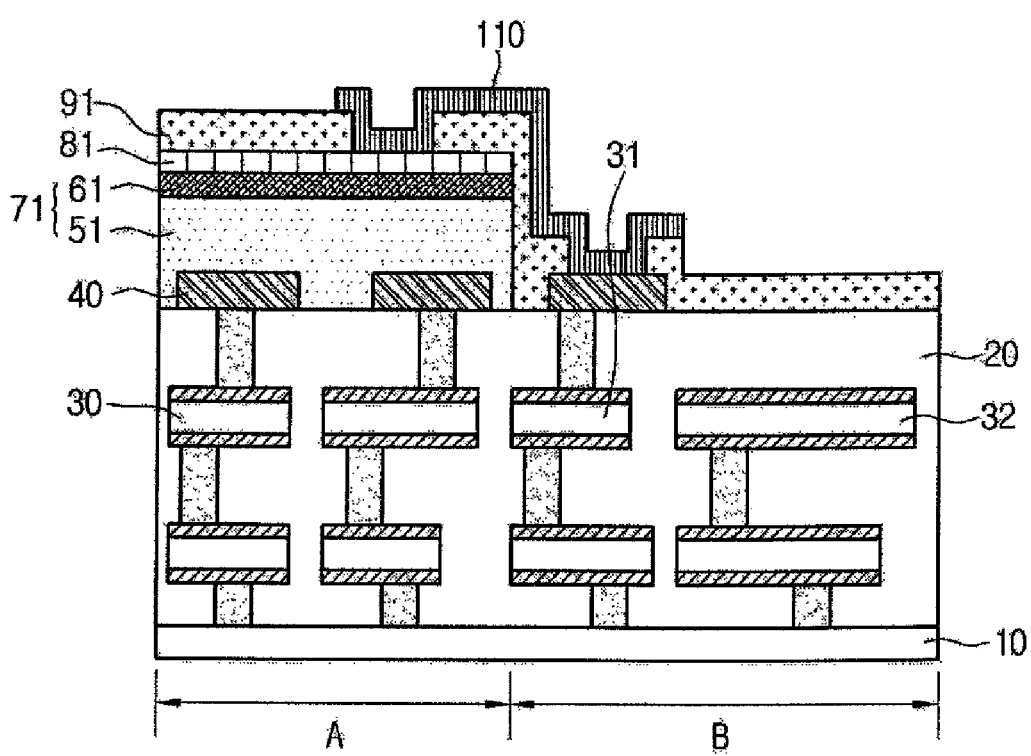

Referring to example FIG. 9, an upper wiring 110 connected to the upper electrode 81 is formed over the first and second open holes 92 and 93 of the passivation layer 91. The upper wiring 110 may be formed using a photoresist pattern covering the region corresponding to the first and second open holes 92 and 93. When the upper wiring layer 100 is etched using the photoresist pattern as a etching mask, an upper wiring 110 is formed which is electrically connected to the upper electrode 81 of the pixel region A and the lower electrode 40 connected to the metal wiring 31 of peripheral circuit region B.

The upper wiring 110 extends from the upper portion of passivation layer 91 and the first open hole 92 to the lower portion of passivation layer 91 and the second open hole 93. Therefore, the upper wiring 110 is electrically connected to the upper electrode 81 of the pixel region A and the lower electrode 40 of peripheral circuit region B, respectively. Also, the upper wiring 110 is formed to selectively expose a portion of the passivation layer 91 over the pixel region A and a portion of the passivation layer 91 over the peripheral circuit region B.

A color filter forming process and pad open process as described below are performed over the passivation layer 91 over which the upper wiring 110 is not formed. Since the upper wiring 110 extends from the upper portion of the passivation layer 91 formed with the first open hole 92 to the lower portion of the passivation layer 91 formed with the second open hole 93, it may be formed to cover the side region of the photo diode 71. Therefore, the light incident to the side of the photo diode 71 is blocked by the upper wiring 110 so cross talk and noise in the image sensor can be blocked.

Figure 10:
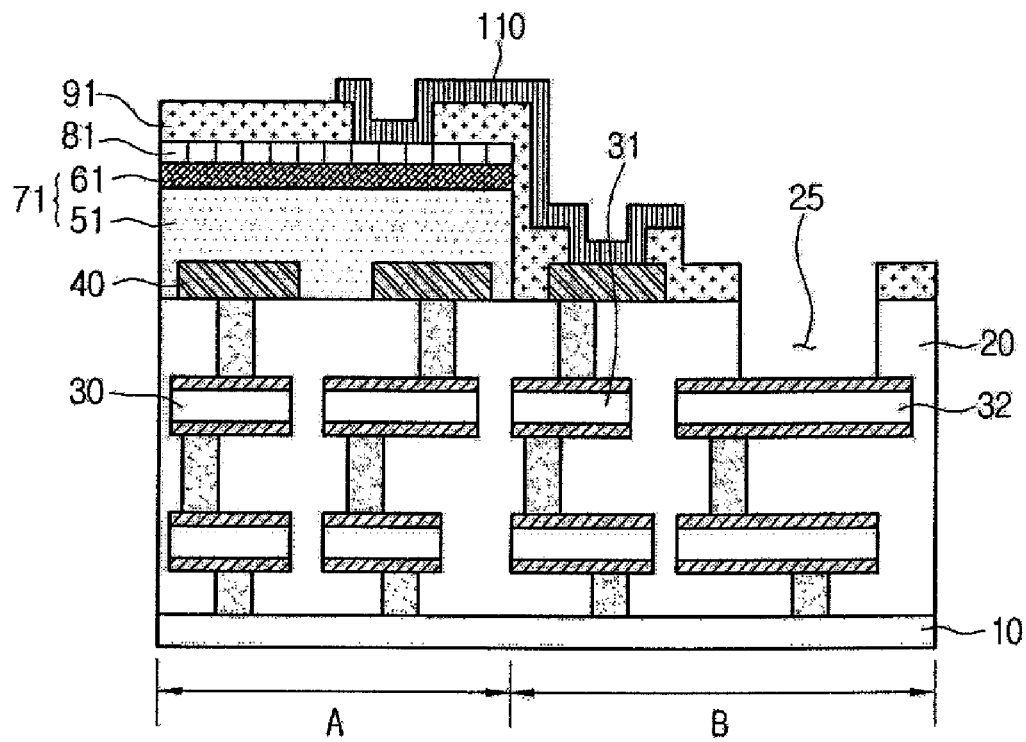

Referring to example FIG. 10, the pad 32 formed over the peripheral circuit region B is exposed. A photoresist pattern is formed with an opening part in the region corresponding to the pad 32 over the passivation layer 91. The passivation layer 91 and the interlayer dielectric layer 20 are etched using the photoresist pattern as the etching mask, to form the pad open hole 25 which exposes pad 32.

Figure 11:
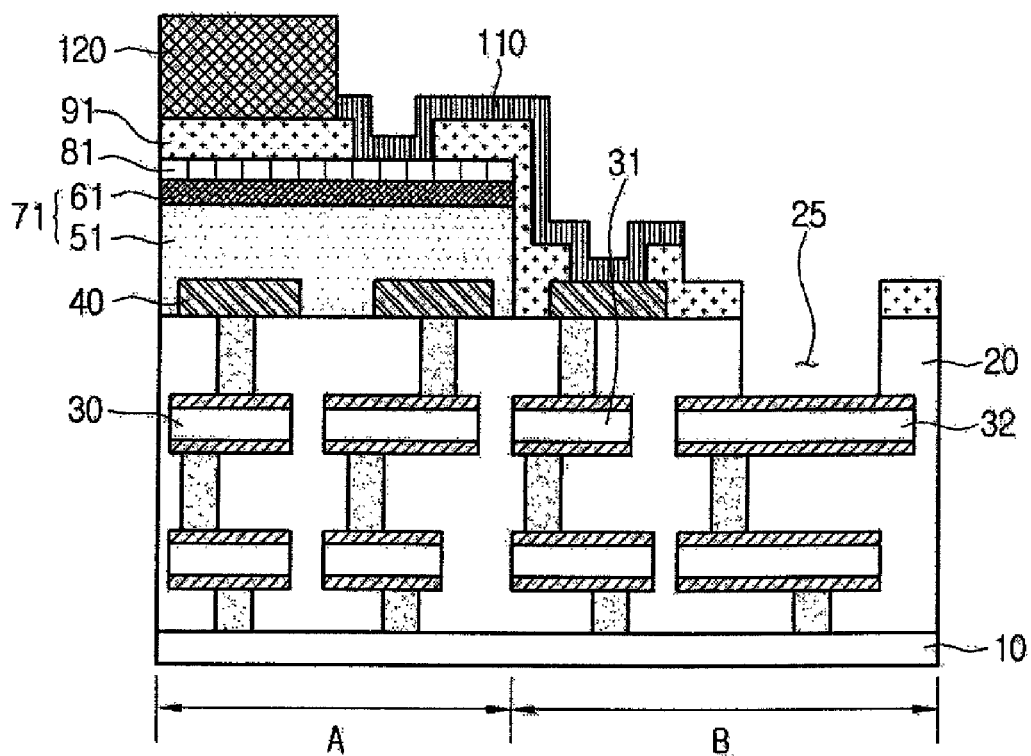

Referring to example FIG. 11, the color filter 120 is formed over the passivation layer 91 exposed on the pixel region A. The color filter 120 can be formed by exposing and developing the color filter layer by means of a pattern mask. For example, the color filter 120 may be formed of three color filters in order to implement a color image. A dyed photoresist may be used as a material, and one color filter 120 per unit pixel is used to separate colors from incident light. The color filters are formed of three colors such as red, green, and blue or magenta, cyan, and yellow so that the neighboring color filters are slightly overlapped with each other to have a step.

Referring to example FIG. 12, a protective layer 130 is formed to supplement the step of the color filter 120 and to protect the surface of the color filter 120. For example, the protective layer 130 can be formed of a low temperature oxide film (LTO) or a photoresist film. Alternatively, the protective film 130 may be omitted. After this, a microlens process can additionally be performed to form a microlens.

In embodiments, the photo diode with an IP structure may be formed over the semiconductor substrate to provide the vertical integration of the transistor circuit and the photo diode so that the fill factor may approach 100%. The passivation layer may be formed over the upper portion of the photo diode to protect the surface of the photo diode. After the formation of the passivation layer, $H_2$ ions may be diffused into the CMOS circuit region through the heat treatment under an $H_2$ atmosphere, making it possible to improve the optical characteristics of the image sensor. The upper wirings may be formed over the upper electrode over the photo diode and the lower electrode over the peripheral circuit region so that external electrical signals may be applied. The upper wiring surrounds the side region of the photodiode to block external light incident to the side of the photo diode, and prevent cross talk and noise in the image sensor.

Figure 21:
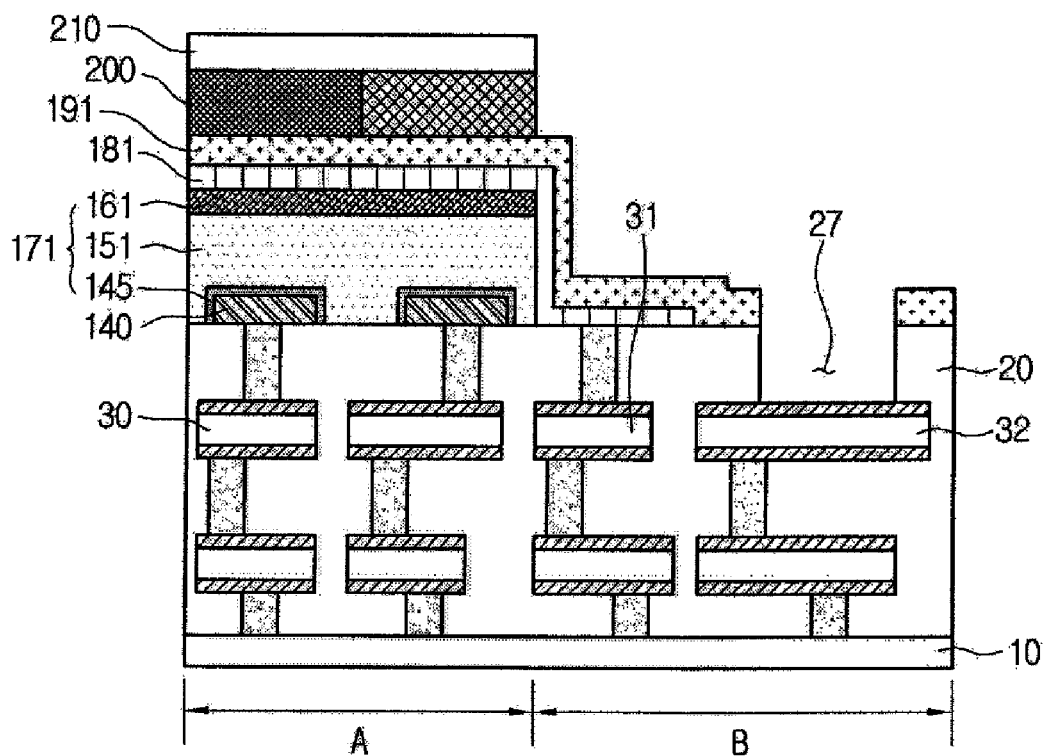

Example FIG. 21 is a cross-sectional view according to embodiments. The image sensor according to embodiments includes a semiconductor substrate 10 having a pixel region A and a peripheral circuit region B. An interlayer dielectric layer 20 having metal wirings 30 and 31 and a pad 32 may be formed over the semiconductor substrate 10. A lower electrode 140 may be selectively formed over the metal wirings 30 and 31. A photo diode 171 may be formed over the interlayer dielectric layer 20 of the pixel region A. An upper electrode 181 may be formed over the photo diode 171. A passivation layer 191 may be formed over the upper electrode 181.

The photo diode 171 may be formed of a first conductive layer 145, an intrinsic layer 151 and a second conductive layer 161. A color filter 200 and a protective layer 210 may be formed over the passivation layer 191. The upper electrode 181 may be formed over the photo diode 171 and the interlayer dielectric layer 20 having the metal wiring 31 in the peripheral circuit region B. The passivation layer 191 may be formed to surround the upper portion of the upper electrode 181. For example, the passivation layer 191 may be formed of any one of an oxide film and a nitride film.

Hereinafter, a method for manufacturing an image sensor according to embodiments will be described referring to example FIGS. 13 to 21. Referring to example FIG. 13, the interlayer dielectric layer 20 having the metal wirings 30 and 31 is formed over the semiconductor substrate 10 over which the pixel region A and the peripheral circuit region B are formed. A process of forming the interlayer dielectric layer 20, the metal wirings 30 and 31, the pad 32, and the lower electrode 140 formed over the semiconductor substrate 10 is substantially the same as embodiments as described above and therefore, the description thereof will be omitted. In particular, in embodiments, the lower electrode 140 may be formed only over the metal wiring 30 over the pixel region A.

Figure 14:
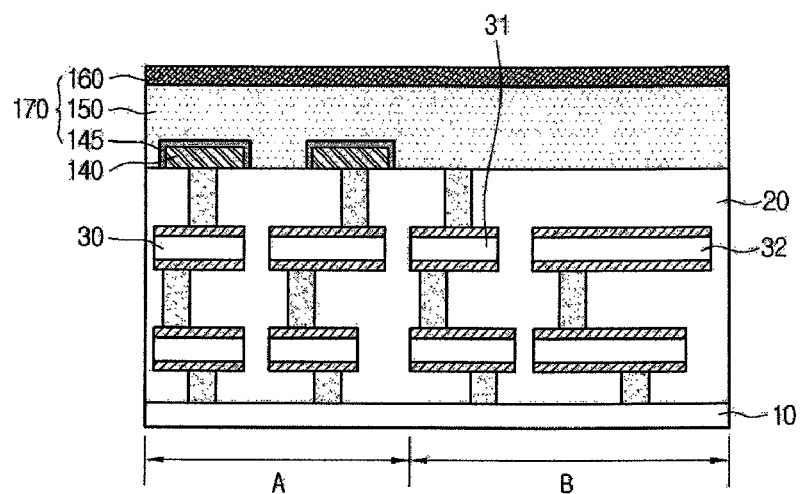

Referring to example FIG. 14, the photo diode 170 may be formed over the interlayer dielectric layer 20. The photo diode 170 may be formed of a first conductive layer 145, an intrinsic layer 150, and a second conductive layer 160. The first conductive layer 145 is formed to surround the lower electrode 40 formed over the pixel region A. The first conductive layer 145 can perform a role of an N layer of a P-I-N diode. That is, the first conductive layer 145 may be an N-type conductive layer, but it is not limited thereto. The first conductive layer 145 may be formed using n-doped amorphous silicon, but is not limited thereto. In other words, the first conductive layer 145 may be formed of a-Si:H, a-SiGe:H, a-SiC, a-SiN:H a-SiO:H, etc by adding germanium, carbon, nitrogen, or oxygen, etc to amorphous silicon.

The first conductive layer 145 can be formed a chemical vapor deposition CVD, in particular, a PECVD. For example, the first conductive layer 145 may be formed of the n-doped amorphous silicon by mixing $PH_3$, $P_2H_5$, etc., with silane gas (SiH4) and depositing it at about 100° C. to 400° C. by means of the PECVD. The first conductive layer 145 may be formed to surround the lower electrode 140 so that it is formed only over the upper portion of the metal wiring 30 separated by the unit pixel, making it possible to separate the photo diode 170 by the unit pixel. The intrinsic layer 150 is formed over the interlayer dielectric layer 20 over which the first conductive layer 145 is formed. The intrinsic layer 150 is substantially the same as the intrinsic layer 50 adopted in other embodiments and therefore, the description thereof will be omitted.

The second conductive layer 160 is formed over the interlayer dielectric layer 20 over which the intrinsic layer 150 is formed. The second conductive layer 160 is substantially the same as the conductive layer 60 adopted in other embodiments and therefore, the description thereof will be omitted. The first conductive layer 145, the intrinsic layer 150, and the second conductive layer 160 are patterned through the photolithography process.

Figure 15:
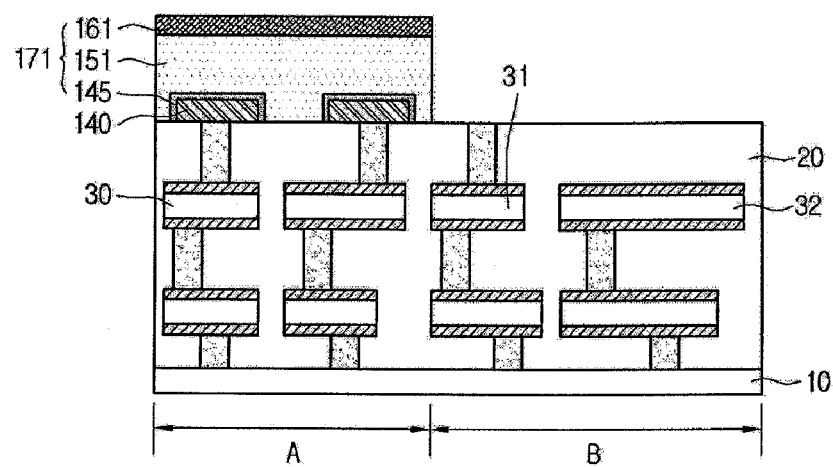

As shown in example FIG. 15, the photo diode 171 formed of the first conductive layer 145, the intrinsic layer 151, and the second conductive layer 161 remains only over the pixel region A. In the photo diode 171, the first conductive layer 145, the intrinsic layer 150, and the second conductive layer 160 on the peripheral circuit region B are removed through the photolithography process so that the photo diode 171 is formed only over the pixel region A. Then, the interlayer dielectric layer 20 and the metal wiring 31 of the peripheral circuit region B may be exposed.

Figure 16:
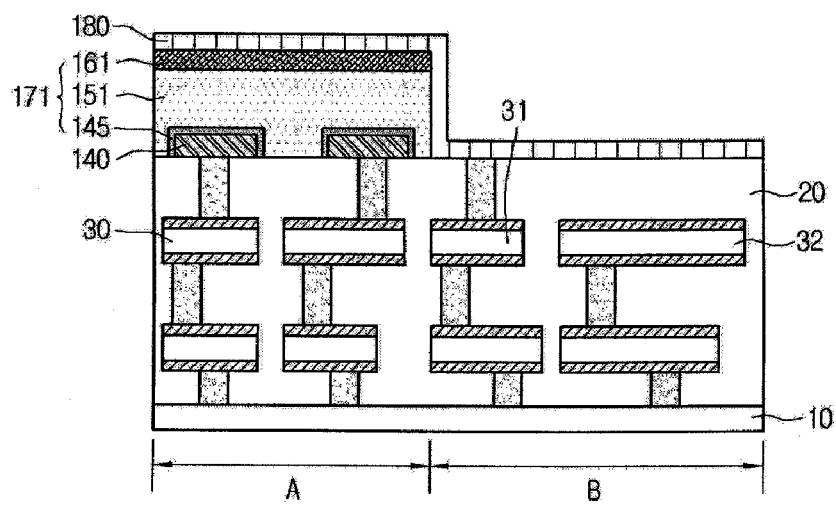

Referring to example FIG. 16, the upper electrode 180 is formed over the interlayer dielectric layer 20 over which the photo diode 171 is formed. The upper electrode 180 may be formed of a highly transparent and highly conductive material. For example, the upper electrode 180 can be formed of any one of indium tin oxide (ITO), cadmium tin oxide (CTO), and $ZnO_2$.

Figure 17:
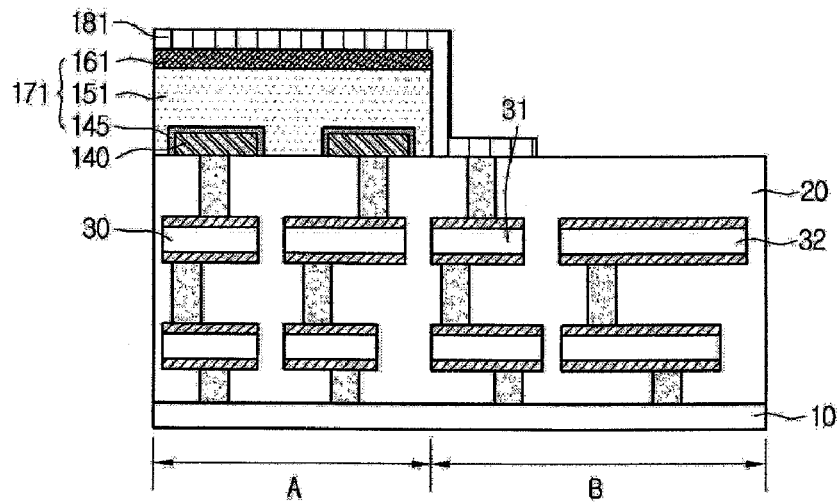

Referring to example FIG. 17, the upper electrode 181 is formed only over the photo diode 171 and the metal wiring 31 of the peripheral circuit region B by etching the upper electrode 180. The upper electrode 181 is formed over the upper portion and side portion of the photo diode 171 and over the interlayer dielectric layer 20 having the metal wiring 31 of the peripheral circuit region B through the photolithography process. Then, the upper surface of the interlayer dielectric layer 20 corresponding to the pad 32 of the peripheral circuit region B is exposed. The photo diode 171 and the metal wiring 31 of the peripheral circuit region B may be electrically connected by the upper electrode 181.

Figure 18:
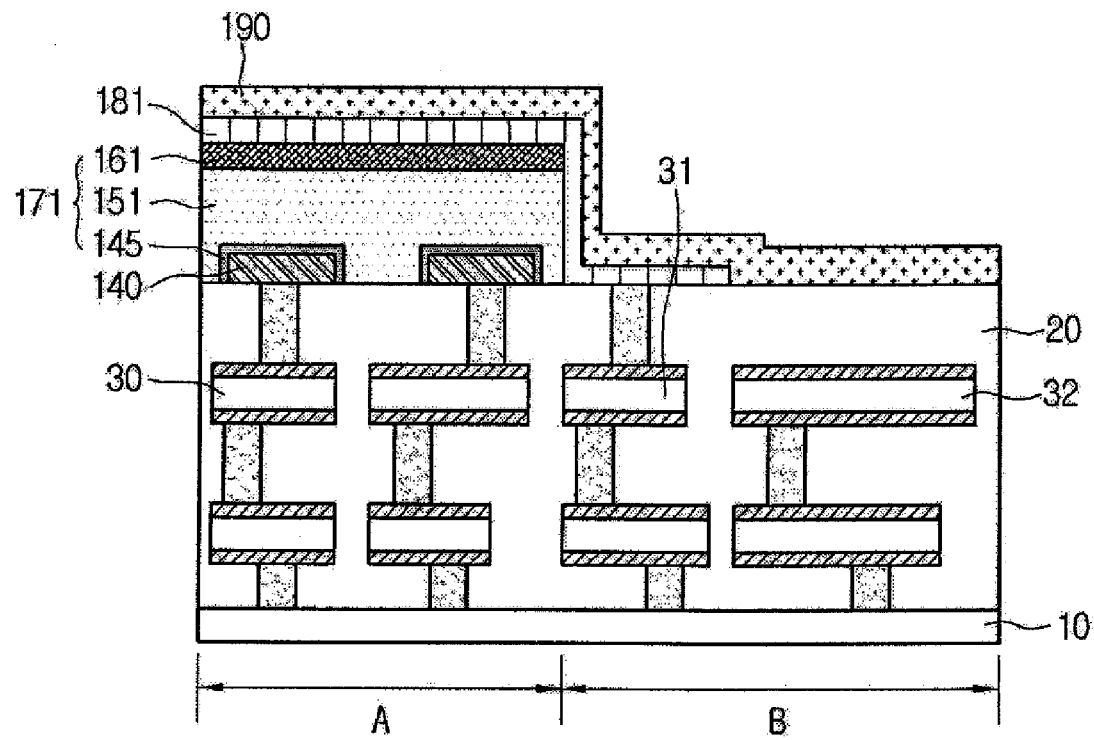

Referring to example FIG. 18, the passivation layer 190 may be formed over the interlayer dielectric layer 20 having the upper electrode 181. For example, the passivation layer 190 may be formed of an oxide film ($SiO_2$) or a nitride film (SiN) through the PECVD process. After the formation of the passivation layer 190, a heat treatment may be performed at a temperature of 200° C. to 400° C. under $H_2$ atmosphere. Then, $H_2$ ions are diffused into the CMOS circuit region to improve the characteristics of the image sensor. Also, since the passivation layer 190 surrounds the side region of the photodiode 170, it blocks the light incident to the side portion of the photo diode 170 so that cross talk and noise can be reduced.

Figure 19:
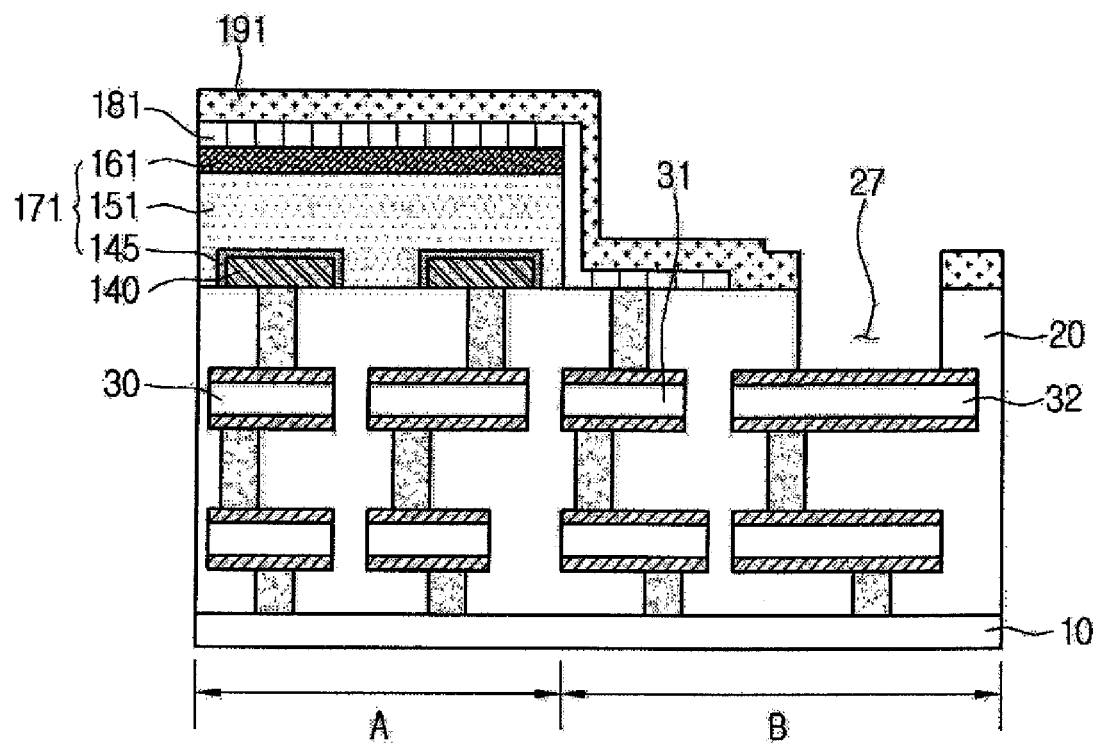

Referring to example FIG. 19, the pad 32 formed over the peripheral circuit region B is exposed. A photoresist pattern is formed over the passivation layer 190 with an opening over the pad 32. The passivation layer 90 and the interlayer dielectric layer 20 are etched using the photoresist pattern as a mask, to form the pad open hole 27 exposing pad 32.

Figure 20:
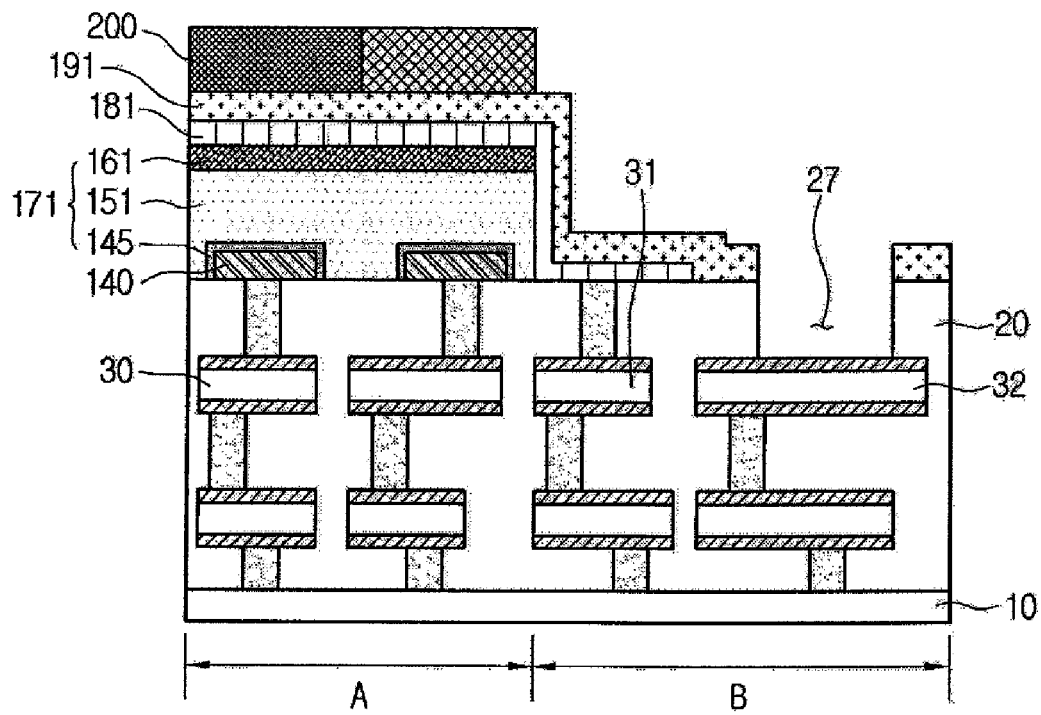

Referring to example FIG. 20, a color filter 200 may be formed over the passivation layer 191 over the pixel region A. One color filter 200 per unit pixel is formed to separate colors from incident light.

Referring to example FIG. 21, a protective layer 210 is formed to supplement the step of the color filter 200 and to protect the surface of the color filter 200. For example, the protective layer 210 can be formed of a low temperature oxide film (LTO) or a photoresist film. Or, the protective film 200 may be omitted. A microlens process may also be performed to form microlenses.

In embodiments, the photo diode in a P-I-N structure may be formed over the semiconductor substrate to provide vertical integration of transistor circuits and photo diodes so that the fill factor may approach 100%. The passivation layer may be formed over the upper portion of the photo diode to protect the surface of the photo diode. In the process of forming the passivation layer, the $H_2$ ions are diffused into the CMOS circuit region, to improve the optical characteristics of the image sensor. The conductive upper electrode may be formed up to the photo diode and the metal wirings over the peripheral circuit region so that electrical signals may be applied to the pixel region and the peripheral region.

The image sensor and method for manufacturing thereof may provide vertical integration of the transistor circuit and the photo diode. Also, the fill factor may approach 100% by vertical integration of the transistor circuit and the photo diode. Higher sensitivity may be provided by vertical integration using the same pixel size, as compared to the related art. In addition, more complicated circuits may be implemented without reducing sensitivity in each unit pixel. A vertical photo diode may be adopted but the light incident to the side surface of the photo diode may be blocked to reduce crosstalk and noise between the pixels, making it possible to improve the reliability of the image sensor. In implementing the unit pixel of the photo diode, the surface area of the photo diode in the unit pixel may be increased, making it possible to improve light sensitivity. Also, the passivation layer may be formed over the upper portion of the photo diode, making it possible to block light as well as improve the optical characteristics of the transistor region.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
a semiconductor substrate having a pixel region and a peripheral circuit region;
an interlayer dielectric layer having metal wirings and a pad formed over the semiconductor substrate;
a lower electrode selectively formed over the metal wirings;
a photo diode formed over the interlayer dielectric layer of the pixel region;
an upper electrode formed over the photo diode; and
a passivation layer formed over the upper electrode,
wherein the passivation layer is provided with a first hole and a second hole that expose the upper electrode and the lower electrode over the peripheral circuit region, respectively.

2. The apparatus of claim 1, comprising an upper wiring formed over the first hole and the second hole of the passivation layer and connected to the upper electrode of the pixel region.

3. The apparatus of claim 2, wherein the upper wiring extends to connect the upper electrode of the pixel region to the lower electrode of the peripheral circuit region.

4. The apparatus of claim 2, wherein the upper wiring is formed to surround a side region of the photo diode.

5. The apparatus of claim 1, comprising:
a color filter formed over the upper electrode; and
a protective film formed over the color filter.

6. The apparatus of claim 1, wherein the photo diode comprises:
an intrinsic layer formed over the interlayer dielectric layer of the pixel region; and
a conductive layer formed over the intrinsic layer.

7. The apparatus of claim 1, wherein the photo diode comprises:
a first conductive layer formed over the interlayer dielectric layer of the pixel region;
an intrinsic layer formed over the first conductive layer; and
a second conductive layer formed over the intrinsic layer.

8. The apparatus of claim 7, wherein the first conductive layer surrounds the lower electrode of the pixel region.

9. The apparatus of claim 1, wherein the upper electrode is formed over the photo diode and the interlayer dielectric layer having the metal wiring of the peripheral circuit region.

10. The apparatus of claim 9, wherein the upper electrode surrounds an upper portion and a side surface of the photo diode.

11. The apparatus of claim 1, wherein the passivation layer is formed of at least one of an oxide film and a nitride film.

* * * * *